United States Patent [19]
Chen

[11] Patent Number: 5,880,495
[45] Date of Patent: Mar. 9, 1999

[54] ACTIVE PIXEL WITH A PINNED PHOTODIODE

[75] Inventor: Datong Chen, Fremont, Calif.

[73] Assignee: OmniVision Technologies, Inc., Sunnyvale, Calif.

[21] Appl. No.: 4,215

[22] Filed: Jan. 8, 1998

[51] Int. Cl.[6] .................................................. H01L 31/062
[52] U.S. Cl. .......................... 257/233; 257/291; 257/292
[58] Field of Search ..................................... 257/233, 239, 257/290, 291, 292, 369

[56] References Cited

U.S. PATENT DOCUMENTS 5,471,515  11/1995  Fossum et al. ......................... 257/239
5,625,210   4/1997  Lee et al. ............................... 257/292

Primary Examiner—Minh Loan Tran
Attorney, Agent, or Firm—Christensen O'Connor Johnson & Kindness PLLC

[57] ABSTRACT

An active pixel for use in an imaging array and formed in a semiconductor substrate having a first conductivity type. The active pixel comprises: a pinned photodiode formed in the semiconductor substrate; a transfer well having a second conductivity type formed in the substrate, the transfer well being adjacent to the pinned photodiode; a transfer gate adjacent the transfer well, the transfer gate for controlling the flow of a signal charge from the pinned photodiode through the transfer well and under the transfer gate; and an output well adjacent the transfer gate for receiving the signal charge and routing the signal charge to output circuitry.

4 Claims, 2 Drawing Sheets

ACTIVE PIXEL WITH A PINNED PHOTODIODE

TECHNICAL FIELD OF THE INVENTION

The present invention relates to image sensing devices, and more particularly, to an active pixel pinned photodiode imaging array.

BACKGROUND OF THE INVENTION

Integrated circuit implementations of imaging arrays have undergone significant development over the past twenty years. One widely used technology in the pixels of imaging arrays is the charged coupled device (CCD). The CCD device has been made popular by its oftentimes superior performance characteristics. However, one drawback of the CCD image sensor is that signal processing elements cannot be manufactured using the same process that is used to manufacture CCD devices. Therefore, signal processing circuitry must be located in a separate integrated circuit.

Another class of image sensors are the active pixel sensors. As noted in U.S. Pat. No. 5,625,210 to Lee et al. ("the '210 patent), an active pixel sensor refers to electronic image sensors within active devices, such as transistors, that are associated with each pixel. The active pixel sensor has the advantage of being able to incorporate both signal processing and sensing circuitry within the same integrated circuit. Conventional active pixel sensors typically employ polysilicon photocapacitors or photodiodes as the active image sensing elements.

A device known as a pinned photodiode has gained favor for its ability to have good color response for blue light, as well as advantages in dark current density and image lag. While the '210 patent provides a method for using a pinned photodiode and an active pixel sensor, the design taught in the '210 patent suffers from the drawback of manufacturing complexity. In particular, as seen in the diagrams of the '210 patent, the manufacturer of such an apparatus requires multiple masking and photolithography steps.

Thus, what is needed, is a method of manufacturing a device having the advantages of an active pixel pinned photodiode as in the '210 patent with a minimum number of photolithography and masking steps. Alternatively stated, what is needed is a new pinned photodiode active pixel structure that can be more easily manufactured.

SUMMARY OF THE INVENTION

An active pixel for use in an imaging array and formed in a semiconductor substrate having a first conductivity type is disclosed. The active pixel comprises: a pinned photodiode formed in the semiconductor substrate; a transfer well having a second conductivity type formed in said substrate, said transfer well adjacent to the pinned photodiode; a transfer gate adjacent the transfer well, the transfer gate for controlling the flow of a signal charge from the pinned photodiode through the transfer well and under the transfer gate; and an output well adjacent the transfer gate for receiving the signal charge and routing the signal charge to output circuitry.

In accordance with other aspects of the present invention, the first conductivity type is p-type and the second conductivity type is n-type.

In accordance with other aspects of the present invention, the active pixel further includes a reset gate adjacent to said output well and a supply voltage well adjacent to said reset gate.

In accordance with other aspects of the present invention, the pinned photodiode is formed by a deep well in the substrate having the second conductivity type and a shallow well atop the deep well, the shallow well having the first conductivity type.

BRIEF DESCRIPTION OF THE DRAWINGS

The foregoing aspects and many of the attendant advantages this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention is an improvement to the active pixel sensor taught in the '210 patent. Thus, much of the description of the operation and circuitry of an active pixel sensor is recited therein, as well as in the references noted in the '210 patent. For brevity, the description will not be repeated herein.

Figure 1:
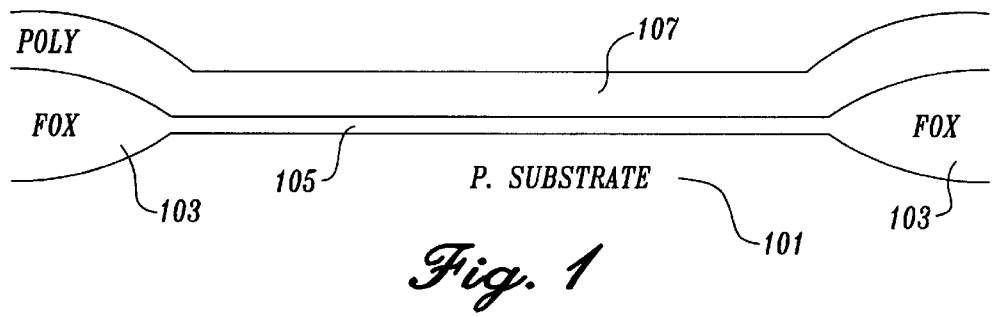
FIGS. 1–7 are schematic diagrams of the steps in manufacturing an active pixel having a pinned photodiode in accordance with the present invention.

Turning first to FIG. 1, a p-type semiconductor substrate 101 is provided. Field oxide regions 103 are formed in the substrate 101 using any suitable conventional semiconductor processing method, such as LOCOS. The field oxide regions 103 define an active area in which the pinned photodiode is formed. Also formed on top of the substrate 101 between the field oxide regions 103 is an isolation oxide 105. The isolation oxide 105 is also referred to as a gate oxide and is preferably formed from silicon dioxide. The method that is used to form the silicon dioxide isolation oxide layer 105 can be one of any well-known techniques including the thermal oxidation of silicon. Additionally, a layer of polysilicon 107 is deposited over the substrate 101. The polysilicon may be deposited using any conventional technique such as low pressure chemical vapor deposition (LPCVD).

Figure 2:
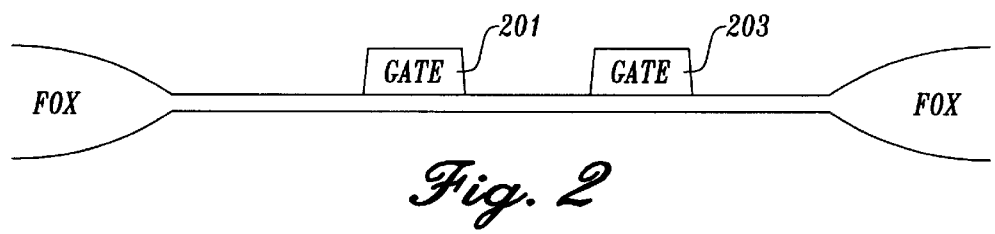

Next, as seen in FIG. 2, the polysilicon layer 107 is patterned and etched using conventional photolithography and masking techniques to form the control gates used in reading out the signal from the active pixel. In this embodiment, a transfer gate 201 is formed and a reset gate 203 is formed.

Figure 3:
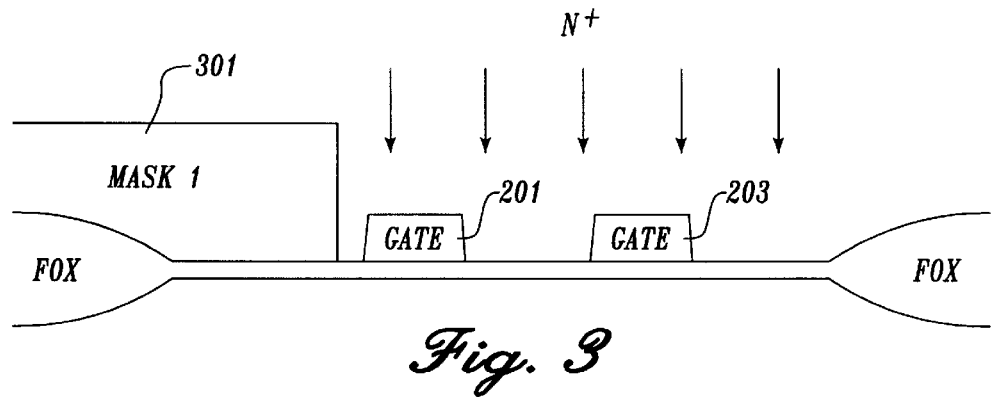

Next, turning to FIG. 3, a first photolithography mask 301 is deposited onto a portion of the active region leaving exposed the transfer gate 201 and the reset gate 203. The mask 301 is formed using conventional photolithography techniques. Note that the first mask 301 does not extend to the transfer gate 201, but stops short of the transfer gate 201. In the preferred embodiment, the first mask 301 leaves a distance of approximately 0.2–0.5 microns to the transfer gate 201.

Figure 4:
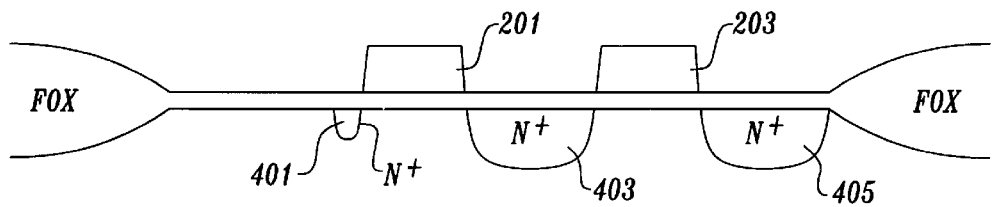

Next, an N+ion implant is performed using the first mask 301 as an implantation mask. The implantation of the $N^+$ is performed using known techniques in the prior art and conventional dopants. The resulting structure is shown in FIG. 4 where three $N^+$ wells 401, 403 and 405 are formed.

Figure 5:
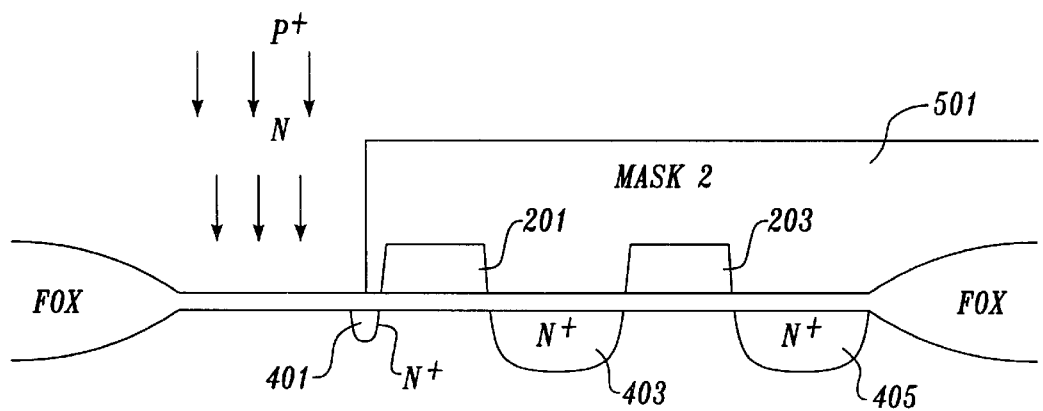

Next, in FIG. 5, a second mask 501 is deposited onto the structure so that the second mask 501 covers nearly all of the active region that was previously left exposed by the first mask 301. Note that in the preferred embodiment, the second mask 501 does not extend completely to the edge of the N+ well 401, but rather just short of the edge. This allows a greater margin of error in the alignment of the second mask 501. It can be appreciated that the N+ well 401 must be in conductive contact with the later formed photodiode. If the second mask 501 extends beyond the N+ well 401, then there will be a non-conductive gap between the photodiode and the N+well 401. Thus, by providing the second mask 501 such that it nominally does not extend to the edge of the N+ well 401, a greater error margin is provided.

Figure 6:
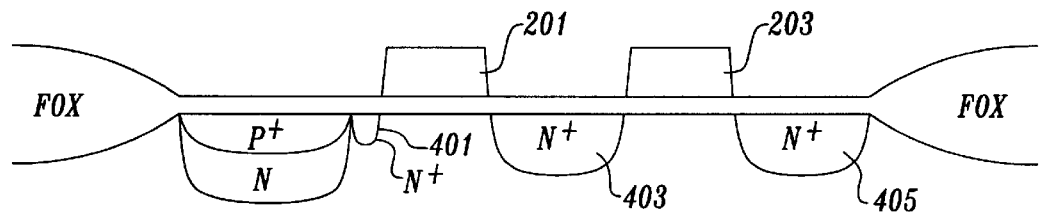

Next, by using sequential implants, a pinned photodiode may be constructed. A first ion implant is performed to create a photodiode by implanting a deep N well impurity. The N well implant is preferably deeper than the previous N+ wells that were formed in FIG. 4. This deeper implant yields substantial increases in photo response due to an increased collection path for the instant photocarriers with the deeper implant. Next, a P+ implant (known as a pinning layer) is then made using high doses of low energy P+ dopant. This forms a shallow P+ well near the surface of the substrate. The resultant structure is shown in FIG. 6.

Figure 7:
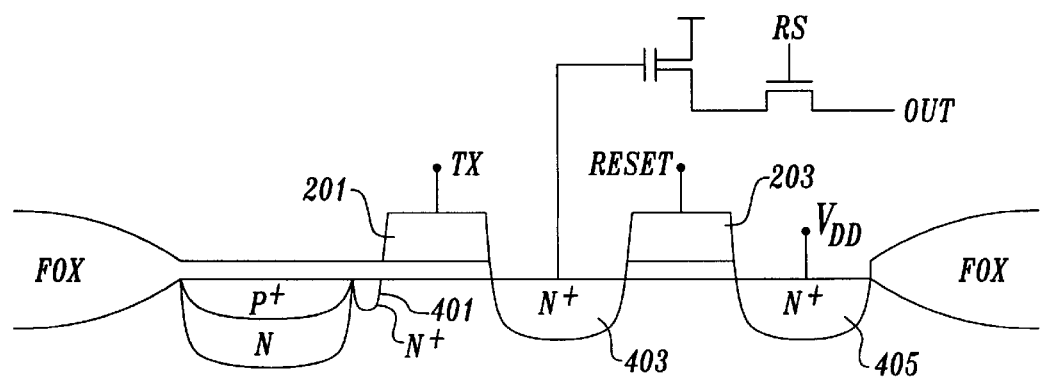

Finally, as seen in FIG. 7, a conventional masking and etching step is used to remove the gate oxide above the source and drain N+ wells 403 and 405. As further described in the '210 patent and as seen in FIG. 7, the N+ well 403 is connected to output circuitry that can readout the signal from the pinned photodiode. The N+ well 403 is also referred to as the output well. The N+ well 405 is connected to a supply voltage $V_{dd}$. The reset gate 203 is periodically activated by a reset signal. When the reset signal is "on", then the channel under the reset gate 203 is conducting and both N+ wells 403 and 405 are equalized at the voltage $V_{dd}$.

The present invention provides a active pixel pinned photodiode structure that can be made with one less mask than the structure taught in the '210 patent. This is accomplished by removing the need for an N− channel underneath the transfer gate as in the '210 patent. Instead, a highly doped N+ well 401 (a "transfer well") adjacent to the transfer gate 201 is formed that aids in the transfer of charge (the photo signal) from the pinned photodiode to the output circuitry. Another advantage of the present invention is that the masking steps shown in the '210 patent to form the lightly doped N− channel underneath the transfer gate must be precisely aligned to be underneath the transfer gate. In contrast, the alignment of the mask in the present invention is relatively robust to misalignment.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An active pixel formed in a semiconductor substrate having a first conductivity type, said active pixel for use in an imaging array, said active pixel comprising:

a pinned photodiode formed in said semiconductor substrate;

a transfer well having a second conductivity type formed in said substrate, said transfer well adjacent said pinned photodiode;

a transfer gate formed adjacent to said transfer well such that said transfer well is positioned substantially between said pinned photodiode and said transfer gate, said transfer gate for controlling the flow of a signal charge from said pinned photodiode through said transfer well and under said transfer gate; and an output well adjacent said transfer gate for receiving said signal charge and routing said signal charge to output circuitry.

2. The active pixel of claim 1 wherein said first conductivity type is p-type and said second conductivity type is n-type.

3. The active pixel of claim 1 further including:

a reset gate adjacent to said output well; and a supply voltage well adjacent to said reset gate.

4. The active pixel of claim 1 wherein said pinned photodiode is formed by a deep well in said substrate having said second conductivity type and a shallow well atop said deep well, said shallow well having said first conductivity type.

* * * * *